US008835208B2

(12) United States Patent
Kurokawa

(10) Patent No.: US 8,835,208 B2
(45) Date of Patent: Sep. 16, 2014

(54) METHOD FOR MANUFACTURING DETECTING ELEMENT, METHOD FOR MANUFACTURING IMAGING DEVICE, DETECTING ELEMENT, IMAGING DEVICE, AND ELECTRONIC DEVICE

(71) Applicant: Seiko Epson Corporation, Tokyo (JP)

(72) Inventor: Kenichi Kurokawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/853,473

(22) Filed: Mar. 29, 2013

(65) Prior Publication Data
US 2013/0256823 A1  Oct. 3, 2013

(30) Foreign Application Priority Data
Apr. 2, 2012 (JP) .................................. 2012-083626

(51) Int. Cl.
| | |
|---|---|
| H01L 21/00 | (2006.01) |
| H01L 37/02 | (2006.01) |
| H01L 31/02 | (2006.01) |
| G01J 5/34 | (2006.01) |
| H01L 27/146 | (2006.01) |

(52) U.S. Cl.
CPC ............... *H01L 37/02* (2013.01); *H01L 31/02* (2013.01); *G01J 5/34* (2013.01); *H01L 27/14649* (2013.01)
USPC ............................. 438/54; 257/431; 257/443

(58) Field of Classification Search
CPC ......... H01L 27/00; H01L 37/00; H01L 31/00; G01J 5/00
USPC ..................................... 257/431, 443; 438/54
See application file for complete search history.

(56) References Cited

U.S. PATENT DOCUMENTS

| 7,183,551 B2 | 2/2007 | Itoh |
| 2011/0233408 A1 | 9/2011 | Noda et al. |

FOREIGN PATENT DOCUMENTS

| JP | 2005-175069 A | 6/2005 |
| JP | 2006-146063 A | 6/2006 |
| JP | 2011-203168 A | 10/2011 |

*Primary Examiner* — Telly Greem
(74) *Attorney, Agent, or Firm* — Global IP Counselors, LLP

(57) ABSTRACT

A detecting element has an absorbing section where a temperature rises according to an amount of electromagnetic waves which are absorbed and a detecting section where characteristics change according to an amount of heat which is transmitted from the absorbing section. A method for manufacturing the detecting element includes: forming the detecting section on a substrate; forming a protective film which covers the detecting section; forming a hollow space portion in a region which overlaps with the detecting section of the substrate in a planar view after the forming of the protective film; and forming the absorbing section by applying a liquid body, which contains a material constituting the absorbing section, in a region on the protective film on an opposite side from the detection section, which overlaps with the detecting section in a planar view, and solidifying the liquid body after the forming of the hollow space portion.

6 Claims, 13 Drawing Sheets

METHOD FOR MANUFACTURING DETECTING ELEMENT, METHOD FOR MANUFACTURING IMAGING DEVICE, DETECTING ELEMENT, IMAGING DEVICE, AND ELECTRONIC DEVICE

CROSS-REFERENCE TO RELATED APPLICATIONS

This application claims priority to Japanese Patent Application No. 2012-083626 filed on Apr. 2, 2012. The entire disclosure of Japanese Patent Application No. 2012-083626 is hereby incorporated herein by reference.

BACKGROUND

1. Technical Field

The present invention relates to a method for manufacturing a detecting element, a method for manufacturing an imaging device, a detecting element, an imaging device, an electronic device, and the like.

2. Related Art

In the past, pyroelectric detecting elements have been known as one example of a detecting element (for example, refer to Japanese Laid-Open Patent Application Publication No. 2011-203168).

SUMMARY

In the detecting element described in the publication described above, it is possible to detect infrared rays which are one type of electromagnetic wave. In the detecting element, an infrared ray absorbing body emits heat due to the infrared absorber absorbing infrared rays and it is possible to detect infrared rays based on changes in the amount of polarization of a capacitor due to heat.

In such pyroelectric detecting elements, it is preferable that the thickness of the absorbing body which absorbs electromagnetic waves be thick from the point of view of increasing the absorption rate of the electromagnetic waves. However, when the thickness of the absorbing body is increased, it is difficult to secure the thickness of the protective film which covers the absorbing body in order to protect the absorbing body. In other words, when the thickness of the absorbing body is increased, it is easy for the step coverage of the protective film which covers the absorbing body to decrease. When the step coverage decreases, it is easy for the function of protecting the absorbing body to be decreased. As a result, it is easy for productivity and reliability of the detecting element to decrease.

That is, in detecting elements in the related art, there is a problem in that it is difficult to improve productivity and reliability.

The present invention has been made to address at least part of the circumstances described above, and it is possible for the present invention to be achieved as embodiments or application examples described below.

A method according to one aspect is a method for manufacturing a detecting element, which has an absorbing section where a temperature rises according to an amount of electromagnetic waves which are absorbed and a detecting section where characteristics change according to an amount of heat which is transmitted from the absorbing section. The method includes: forming the detecting section on a substrate; forming a protective film which covers the detecting section; forming a hollow space portion in a region which overlaps with the detecting section of the substrate in a planar view after the forming of the protective film; and forming the absorbing section by applying a liquid body, which contains a material constituting the absorbing section, in a region on the protective film on an opposite side from the detection section, which overlaps with the detecting section in a planar view, and solidifying the liquid body after the forming of the hollow space portion.

In the method for manufacturing of the detecting element of this aspect, since the absorbing section is formed after the hollow space portion is formed, it is possible to avoid damaging the absorbing section due to the forming of the hollow space portion. As a result, it is possible to omit the film which protects the absorbing section. As a result, it is possible to easily improve the productivity and reliability of the detecting element.

In the method for manufacturing the detecting element described above, the forming of the absorbing section preferably includes applying the liquid body by discharging the liquid body as liquid droplets.

In this aspect, a method is adopted in the forming of the absorbing section where a liquid body is applied by discharging the liquid body as liquid droplets. In this method, it is easy for the liquid body to be patterned with high precision. As a result, according to this method for manufacturing of the detecting element, it is possible for it to be easy to arrange the absorbing body with high precision.

In the method for manufacturing the detecting element described above, the forming of the detecting section preferably includes forming a first electrode on the substrate, forming a pyroelectric body on the first electrode on an opposite side from the substrate, and forming a second electrode on the pyroelectric body on an opposite side from the first electrode.

In this aspect, it is possible to manufacture a detecting element which has a configuration where a pyroelectric body is interposed between the first electrode and the second electrode which face each other.

The method for manufacturing the detecting element described above preferably further includes forming a sacrificial layer on the substrate before the forming of the detecting section. The forming of the detecting section preferably includes forming the detecting section in a region which overlaps with the sacrificial layer of the substrate in a planar view, and the forming of the hollow space portion includes forming the hollow space portion by removing the sacrificial layer.

In this aspect, since the sacrificial layer is removed after the detecting section is formed in a region which overlaps with the sacrificial layer, it is possible to easily form the hollow space portion.

In the method for manufacturing the detecting element described above, the forming of the hollow space portion preferably includes forming a hole which reaches the sacrificial layer in the surroundings of the detecting section, and supplying an etchant from the hole and removing the sacrificial layer.

In this aspect, it is possible to remove the sacrificial layer by supplying the etchant from the hole which reaches the sacrificial layer. In this manufacturing method, it is possible to form the hollow space portion by etching. Then, according to this manufacturing method for the detecting element, it is possible to avoid damaging the absorbing section due to the etching in the forming of the hollow space portion. In addition, according to this manufacturing method, it is possible for it to be easy to avoid the liquid body which coats the protective film flowing into the hollow space portion in the forming of the absorbing section.

A method for manufacturing an imaging device according to another aspect includes arranging a plurality of the detecting elements in bi-axial directions using the method for manufacturing the detecting element described above.

In the manufacturing method for the imaging device of this aspect, since the absorbing section is formed after the hollow space portion is formed in the manufacturing of the detecting element, it is possible to avoid damaging the absorbing section due to the forming of the hollow space portion. As a result, it is possible to omit the film which protects the absorbing section. As a result, it is possible to manufacture an imaging device where it is possible for it to be easy to improve the productivity and reliability of the detecting element.

A detecting element according to another aspect includes a substrate, a detecting section, a wiring layer, a protective film, an absorbing section and a hollow space portion. The detecting section is provided on the substrate, characteristics of the detecting section being changed according to transfer of heat. The wiring layer is provided on the detecting section on an opposite side from the substrate. The wiring layer is electrically connected to the detecting section in a region which overlaps with the detecting section in a planar view, and extends to an outside of the region which overlaps with the detecting section. The protective film is provided on the wiring layer on an opposite side from the detecting section and covering the wiring layer and the detecting section. The absorbing section is provided at the protective film on an opposite side from the substrate, a temperature of the absorbing section being configured to rise according to an amount of electromagnetic waves which are absorbed. The hollow space portion is provided in a region which overlaps with the detecting section of the substrate in a planar view.

In the detecting element of this aspect, since a configuration is adopted where the absorbing section is provided at the outside of the protective film which coats the wiring layer and the detecting section, it is possible to form the absorbing section after forming the hollow space portion. Due to this, it is possible to avoid damaging the absorbing section in the forming of the hollow space portion. As a result, it is possible to omit the film which protects the absorbing section. As a result, it is possible for it to be easy to improve the productivity and reliability of the detecting element.

An imaging device according to another aspect includes a plurality of the detecting elements described above arranged in bi-axial directions.

In the imaging device of this aspect, since the detecting element, where it is possible for it to be easy to improve the productivity and reliability, is arranged, it is possible for it to be easy to improve the productivity and reliability of the imaging device.

An electronic device according to another aspect is provided with the detecting element described above.

Since the electronic device of this aspect has a detecting element where it is possible for it to be easy to improve the productivity and reliability, it is possible for it to be easy to improve the productivity and reliability of the electronic device.

An electronic device according to another aspect is provided with the imaging device described above.

Since the electronic device of the aspect has an imaging device where it is possible for it to be easy to improve the productivity and reliability, it is possible for it to be easy to improve the productivity and reliability of the electronic device.

BRIEF DESCRIPTION OF THE DRAWINGS

Referring now to the attached drawings which form a part of this original disclosure.

DETAILED DESCRIPTION OF EXEMPLARY EMBODIMENTS

Embodiments with a camera, which is one example of an electronic device, as an example will be described with reference to the diagrams.

Figure 1:
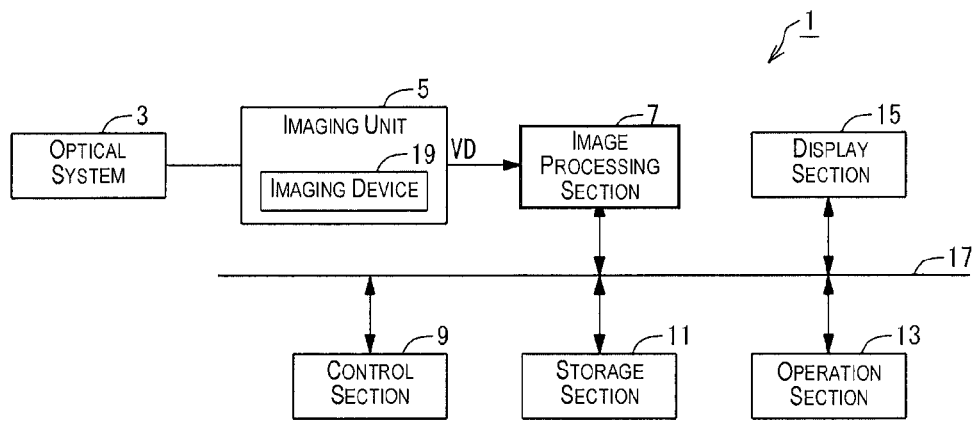
FIG. 1 is a block diagram illustrating main constituent elements of a camera in the present embodiment.

As shown in FIG. 1, which is a block diagram illustrating main constituent elements, a camera 1 in the present embodiment includes an optical system 3, an imaging unit 5, an image processing section 7, a control section 9, a storage section 11, an operation section 13, and a display section 15. The image processing section 7, the control section 9, the storage section 11, the operation section 13, and the display section 15 are connected to each other through a bus 17.

The optical system 3 images an image of an object on an image plane by taking in electromagnetic waves from the object and collecting the electromagnetic waves from the object on the image plane.

The imaging unit 5 has an imaging device 19 which is one example of an electronic device. The imaging device 19 has a plurality of detecting elements which will be described later. The detecting elements detect electromagnetic waves and output a signal according to the amount of the electromagnetic waves which are detected. The electromagnetic waves from the object which are taken in by the optical system 3 described above are imaged as an image in the imaging device 19. The distribution of the amount of electromagnetic waves in the image which was imaged is detected by the plurality of detecting elements. It is possible for the distribution of the amount of electromagnetic waves in the image which was imaged to be represented as an image.

Here, the imaging unit 5 outputs the distribution of the amount of electromagnetic waves in the image which was detected by the imaging device 19 to the image processing section 7 as image data VD.

The image processing section 7 performs various types of image processing such as correction processing with regard to the image which is expressed by the image data VD.

The control section 9 controls the operation of each of the constituent elements in the camera 1.

The storage section 11 stores various types of information. A region which stores the program software where the control procedure of the actions in the camera 1 is written, a region which temporarily develops various types of data, and the like, are set in the storage section 11.

The operation section 13 is an interface for an operator to operate the camera 1 and has various types of input buttons, and the like.

The display section 15 displays an image which is expressed by the image data VD.

According to the camera 1 which has the constituent elements described above, it is possible to image an object and display the object which is imaged as an image.

Here, in the present embodiment, a detecting element where it is possible to detect infrared rays which are one type of electromagnetic waves is adopted as the detecting element of the imaging device 19. Due to this, it is possible to use the camera 1 in thermography, as a night vision device, and the like.

Figure 2:
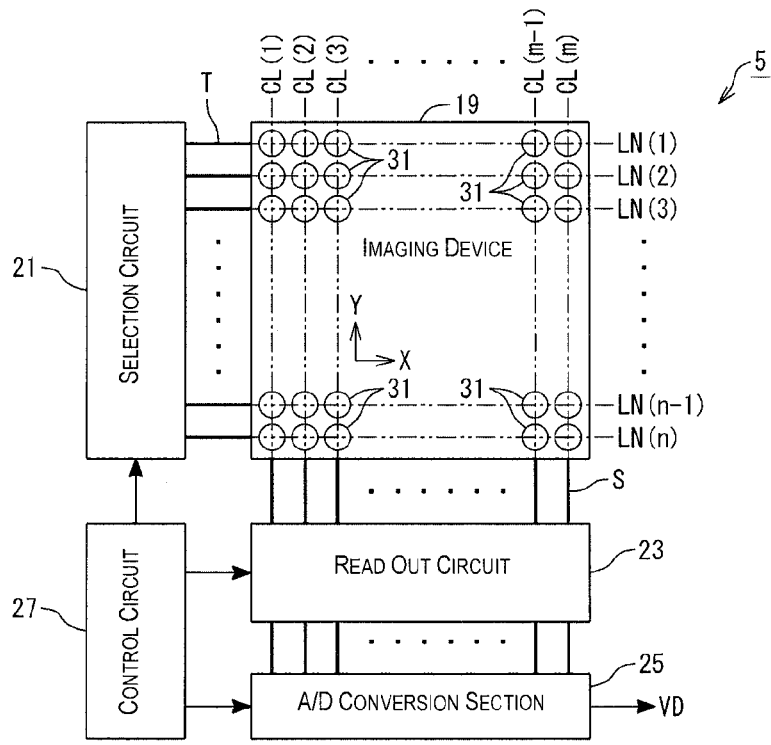
FIG. 2 is a block diagram illustrating main constituent elements of an imaging unit in the present embodiment.

As shown in FIG. 2 which is a block diagram illustrating the main constituent elements, the imaging unit 5 includes the imaging device 19, a selection circuit 21, a read out circuit 23, an A/D conversion section 25, and a control circuit 27.

In the imaging device 19, a plurality of detecting elements 31 are provided. The plurality of detecting elements 31 are arranged in the X direction and the Y direction in the diagram. Then, the plurality of detecting elements 31 configure a matrix with the X direction as the line direction and the Y direction as the column direction.

In the present embodiment, the plurality of detecting elements 31 which are lined up along the Y direction configure one element column CL. In addition, the plurality of detecting elements 31 which are lined up along the X direction configure one element line LN.

In the present embodiment, the imaging device 19 has n (n is an integer of one or more) of the element lines LN and m (m is an integer of one or more) of the element columns CL. That is, in the present embodiment, the plurality of detecting elements 31 configures a matrix of n lines×m columns.

Here, below, in a case where n element lines LN are individually identified, the notation of element line LN (i) is used. i is an integer of one or more and n or less. In addition, in a case where m element columns CL are individually identified, the notation of element column CL (j) is used. j is an integer of one or more and m or less.

Figure 3:
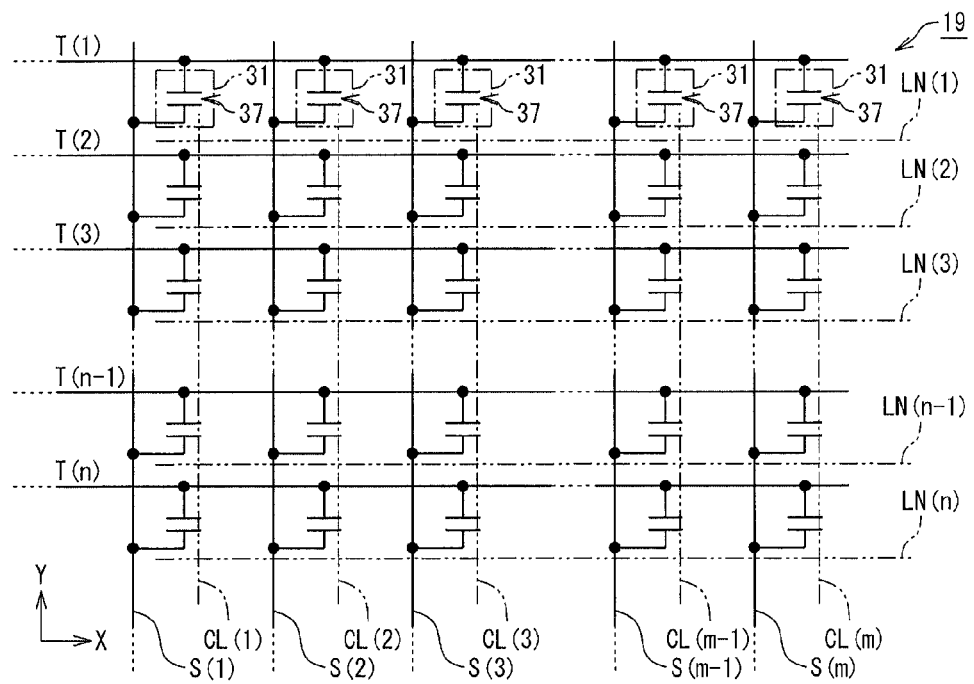
FIG. 3 is an equivalent circuit diagram of an imaging device in the present embodiment.

Here, as shown in FIG. 3 which is an equivalent circuit diagram, the imaging device 19 has n selection lines T and m signal lines S. The n selection lines T are lined up in the Y direction so as to be spaced from each other at intervals. The n selection lines T each extend in the X direction. The m signal lines S are lined up in the X direction so as to be spaced from each other at intervals. The m signal lines S each extend in the Y direction.

The selection lines T are provided for each of the element lines LN. In addition, the signal lines S are provided for each of the element columns CL. That is, one of the element lines LN corresponds to one of the scanning lines T and one of the element columns CL corresponds to one of the signal line S. As a result, below, in a case where n selection lines T are individually identified, the notation of selection line T (i) is used. In addition, in a case where m signal lines S are individually identified, the notation of signal line S (j) is used.

In the present embodiment, the detecting element 31 has a capacitor 37. For each of the element lines LN, one of the electrodes of the capacitor 37 is electrically connected to the corresponding selection line T. In addition, for each of the element columns CL, the other electrode of the capacitor 37 is electrically connected to the corresponding signal line S. As a result, it may also be considered that the detecting elements 31 are provided to correspond to intersections between the selection lines T and the signal lines S.

The selection circuit 21 which is shown in FIG. 2 is electrically connected to each of the selection lines T of the imaging device 19. The selection circuit 21 sequentially outputs selection signals one at a time with regard to the n selection lines T (a selection process). Due to this, in the imaging device 19, the n element lines LN are sequentially selected one at a time.

The read out circuit 23 is electrically connected to each of the signal lines S of the imaging device 19. The read out circuit 23 reads out the detection signal in units of the element lines LN which are selected from the plurality of detecting elements 31 via the m signal lines S (a reading out process). In the detection signals, signal values are reflected according to the amount of light of the infrared rays which is detected by the detecting elements 31.

The A/D conversion section 25 is electrically connected to the read out circuit 23. The A/D conversion section 25 converts analog data on the detecting signals which are read out by the read out circuit 23 to image data VD of digital data and outputs the image data VD (an A/D conversion process).

The control circuit 27 individually controls driving of each of the selection circuit 21, the read out circuit 23, and the A/D conversion section 25. The selection process, read out process and A/D conversion process are controlled by the control circuit 27.

Figure 4:
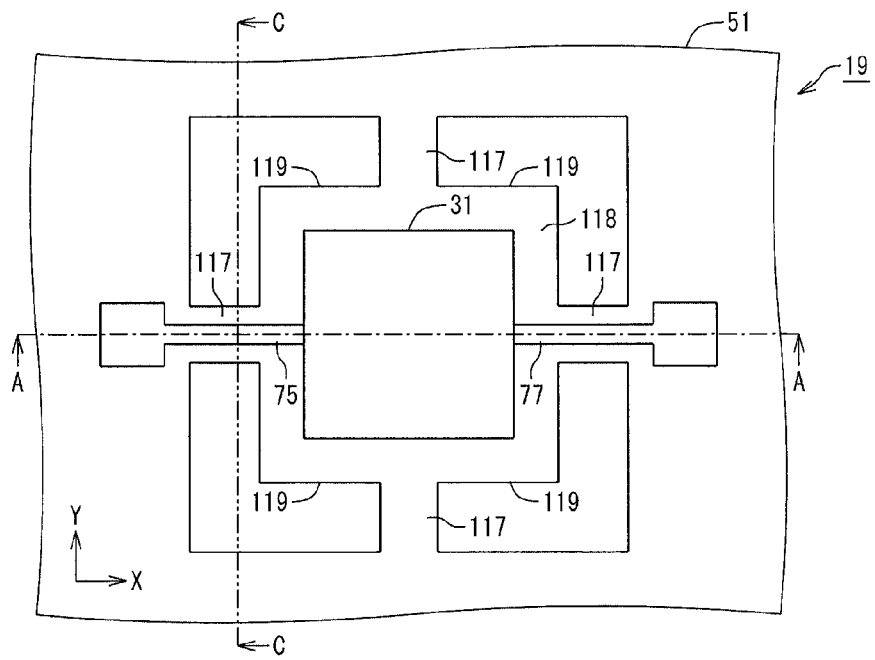
FIG. 4 is a planar diagram illustrating a detecting element in the present embodiment.

As shown in FIG. 4 which is a planar diagram, the detecting elements 31 are provided in an element substrate 51.

Figure 5:
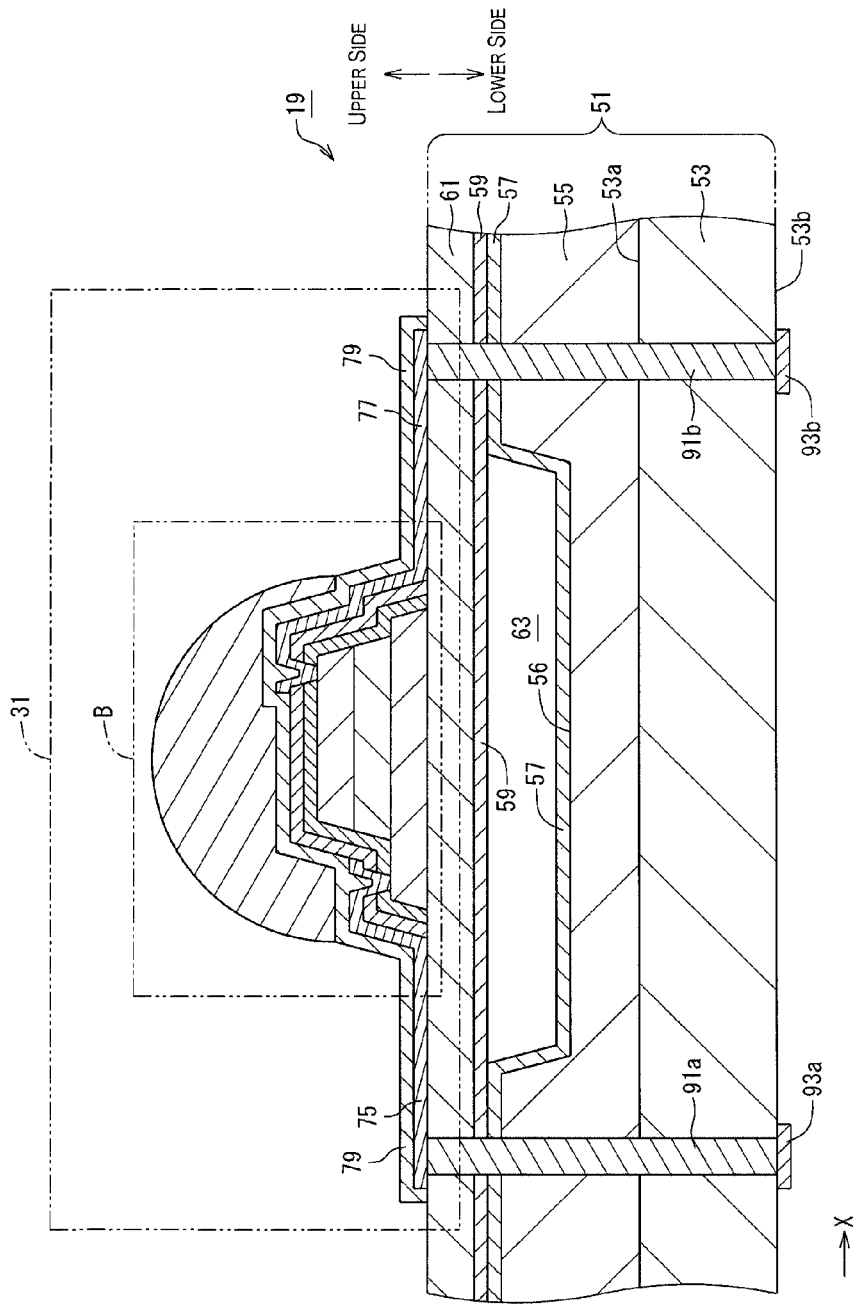
FIG. 5 is a cross sectional diagram along the line A-A in FIG. 4.

As shown in FIG. 5 which is a cross sectional diagram along the line A-A in FIG. 4, the element substrate 51 has a substrate 53, an intermediate layer 55, a protective layer 57, a protective layer 59, and a support layer 61.

For example, the substrate 53 is configured of glass, quartz, silicon, or the like, and has a first surface 53a which is a surface which faces toward the detecting element 31 side and a second surface 53b which is a surface which faces toward the opposite side to the first surface 53a. In the present embodiment, silicon is adopted as the material of the substrate 53. Below, the first surface 53a side of the substrate 53 is referred to as the upper side and the second surface 53b side of the substrate 53 is referred to as the lower side.

The intermediate layer 55 is provided on the first surface 53a of the substrate 53. A concave portion 56 which is concave toward the first surface 53a side (the lower side) is provided on the opposite side (the upper side) to the first surface 53a side in the intermediate layer 55. For example, it is possible for silicon oxide, silicon nitride, or the like to be adopted as the material of the intermediate layer 55. In the present embodiment, silicon oxide is adopted as the material of the intermediate layer 55.

The protective layer 57 is provided on the intermediate layer 55 on the opposite side to the substrate 53 side. The protective layer 57 includes the concave portion 56 and covers the intermediate layer 55 on the opposite side to the substrate 53 side.

The protective layer 59 is provided on the protective layer 57 on the opposite side to the intermediate layer 55. In the concave portion 56, the protective layer 59 is separated from the protective layer 57. In the concave portion 56, a hollow space portion 63 is formed between the protective layer 57 and the protective layer 59.

As the materials of each of the protective layer 57 and the protective layer 59, it is possible to adopt platinum, aluminum, aluminum oxide, nickel, tungsten, molybdenum, iron, or the like, or an alloy which includes at least one of these as a component. In the present embodiment, aluminum oxide is adopted as the material of each of the protective layer 57 and the protective layer 59.

The support layer 61 is provided on the protective layer 59 on the opposite side to the protective layer 57 side. For example, it is possible for silicon oxide, silicon nitride, or the like to be adopted as the material of the support layer 61. In the present embodiment, a configuration where a layer of silicon oxide and a layer of silicon nitride are laminated is adopted as the support layer 61.

The detecting elements 31 are provided on the support layer 61 on the opposite side to the protective layer 59 side. The detecting elements 31 are provided in the region which overlaps with the hollow space portion 63 in a planar view on the support layer 61 on the opposite side to the protective layer 59 side.

Figure 6:
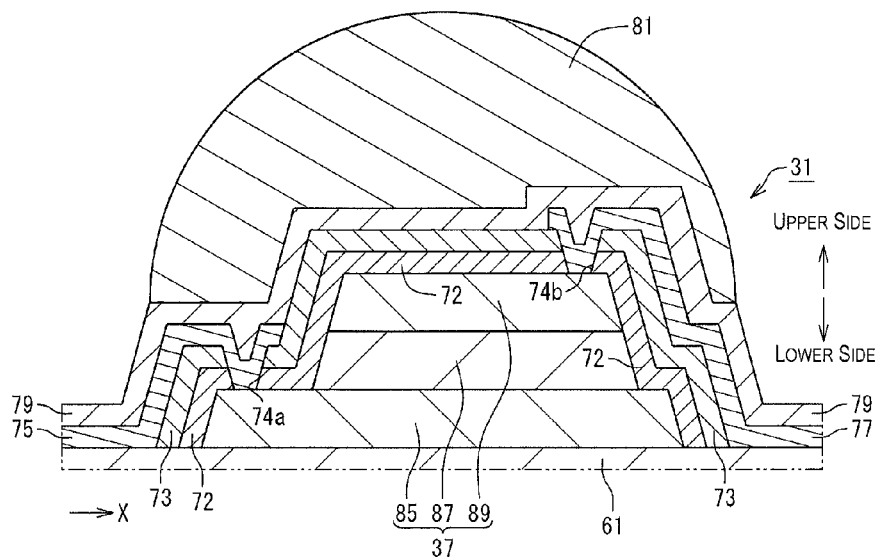
FIG. 6 is an enlarged diagram of a B portion in FIG. 5.

As shown in FIG. 6 which is an enlarged diagram of a B portion in FIG. 5, the detecting elements 31 have the capacitor 37, a protective film 72, an insulating film 73, a first wiring 75, a second wiring 77, a protective film 79, and an absorbing layer 81.

The capacitor 37 is provided on the upper side of the support layer 61, and has a first electrode 85, a pyroelectric body 87, and a second electrode 89.

The first electrode 85 is provided on the upper side of the support layer 61. The pyroelectric body 87 is provided on the first electrode 85 on the opposite side to the support layer 61, that is, the upper side of the first electrode 85. The second electrode 89 is provided on the pyroelectric body 87 on the opposite side to the first electrode 85, that is, the upper side of the pyroelectric body 87.

In the present embodiment, as each of the first electrode 85 and the second electrode 89, a configuration is adopted where iridium, iridium oxide, and platinum are laminated in this order.

In addition, it is possible to adopt lead zirconate titanate (PZT), PZTN where niobium (Nb) is added to PZT, or the like as the material of the pyroelectric body 87.

The protective film 72 is provided on the capacitor 37 on the opposite side to the support layer 61 side, that is, the upper side of the capacitor 37. The protective film 72 covers the capacitor 37 from the upper side. As the material of the protective film 72, for example, it is possible to adopt platinum, aluminum, aluminum oxide, nickel, tungsten, molybdenum, iron, or the like, or an alloy which includes at least one of these as a component. In the present embodiment, aluminum oxide (alumina) is adopted as the material of the protective film 72.

The insulating film 73 is provided on the protective film 72 on the opposite side to the support layer 61 side, that is, the upper side of the protective film 72. The insulating film 73 covers the protective film 72 from the upper side. For example, it is possible for silicon oxide, silicon nitride, or the like to be adopted as the material of the insulating film 73.

A contact hole 74a is provided in the protective film 72 and the insulating film 73 at a site which overlaps with the first electrode 85. In addition, a contact hole 74b is provided in the insulating film 73 at a site which overlaps with the second electrode 89.

The first wiring 75 and the second wiring 77 are each provided on the protective film 72 on the opposite side to the capacitor 37 side, that is, the upper side of the protective film 72. The first wiring 75 is electrically connected to the first electrode 85 through the contact hole 74a. The second wiring 77 is electrically connected to the second electrode 89 through the contact hole 74b. Here, it is possible to adopt a metal such as aluminum as the material of each of the first wiring 75 and the second wiring 77.

The protective film 79 is provided on the upper side of the first wiring 75 and the second wiring 77 and covers the first wiring 75, the second wiring 77, and the capacitor 37 from the upper side. As the material of the protective film 79, for example, it is possible to adopt platinum, aluminum, aluminum oxide, nickel, tungsten, molybdenum, iron, or the like, or an alloy which includes at least one of these as a component. In the present embodiment, aluminum oxide is adopted as the material of the protective film 79.

The absorbing layer 81 is provided in a region, which overlaps with the capacitor 37 in a planar view, in the upper side of the protective film 79. The absorbing layer 81 has a function where infrared rays, which are incident to the detecting elements 31 from the upper side of the detecting elements 31, are absorbed. In addition to an inorganic material such as silicon oxide and silicon nitride, it is possible to adopt metal materials such as oxides or nitrides of aluminum, titanium aluminum, or the like, organic materials to which carbon black, graphite, infrared ray absorbing dyes, or the like are added, or the like, as the material of the absorbing layer 81. Examples of the infrared ray absorbing dyes include anthraquinone based dyes, dithiol nickel complex based dyes, cyanine based dyes, azo cobalt complex based dyes, diimmonium based dyes, squarylium based dyes, phthalocyanine based dyes, naphthalocyanine based dyes, or the like. In the present embodiment, a resin material which contains carbon black is adopted as the material of the absorbing layer 81.

As shown in FIG. 5, the first wiring 75 extends from the region which overlaps with the concave portion 56 to the outside of the region which overlaps with the concave portion 56. The second wiring 77 also extends from the region which overlaps with the concave portion 56 to the outside of the region which overlaps with the concave portion 56.

A plurality of via wirings 91 are provided in the imaging device 19. In the present embodiment, two via wirings 91 are provided with regard to one of the detecting elements 31. Below, in a case where the two via wirings 91 which correspond to one of the detecting elements 31 are each identified, the two via wirings 91 are respectively given notation as a via wiring 91a and a via wiring 91b.

The via wiring 91a is electrically connected to the first electrode 85 through the first wiring 75. The via wiring 91b is electrically connected to the second electrode 89 through the second wiring 77.

The via wiring 91a is provided to the outside of the region which overlaps with the concave portion 56 in a planar view and penetrates the element substrate 51 from the support layer 61 to the second surface 53b of the substrate 53. In addition, the via wiring 91b is provided to the outside of the region which overlaps with the concave portion 56 in a planar view and penetrates the element substrate 51 from the support layer 61 to the second surface 53b of the substrate 53.

Here, as shown in FIG. 4, the detecting elements 31 are provided in an island section 118 which is supported by beams 117. An opening section 119 is provided outside the island section 118 in a region which overlaps with the concave portion 56 (FIG. 5). The opening section 119 is linked to the hollow space portion 63 (FIG. 5).

Figure 7:
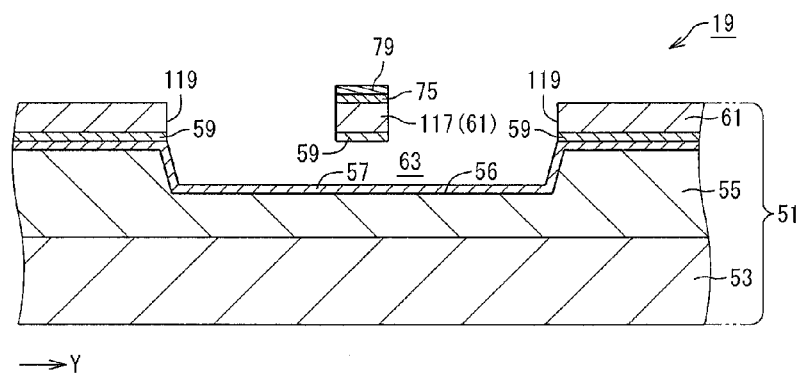
FIG. 7 is a cross sectional diagram along the line C-C in FIG. 4.

As shown in FIG. 7 which is a cross sectional diagram along the line C-C in FIG. 4, the first wiring 75 passes through the upper side of one of the beams 117 and extends from the region which overlaps with the concave portion 56 to the outside of the region which overlaps with the concave portion 56. In the same manner, the second wiring 77 also passes through the upper side of another of the beams 117 and extends from the region which overlaps with the concave portion 56 to the outside of the region which overlaps with the concave portion 56.

In the detecting elements 31 which have the constituent elements described above, the absorbing layer 81 absorbs infrared rays which are irradiated from the upper side of the detecting elements 31. The absorbing layer 81 which absorbs the infrared rays emits heat according to the amount of infrared rays which are absorbed. The heat which is emitted by the absorbing layer 81 is transmitted to the capacitor 37.

In the capacitor 37, the electrical characteristics change according to the heat which is transmitted. According to the change of the electrical characteristics, it is possible to detect the amount of infrared rays. In the present embodiment, the amount of polarization of the pyroelectric body 87 in the capacitor 37 changes. That is, in the present embodiment, it is possible to detect the amount of infrared rays according to changes in the amount of polarization of the pyroelectric body 87 which is one example of an electrical characteristic.

A method for manufacturing the imaging device 19 will be described.

Figure 8A:
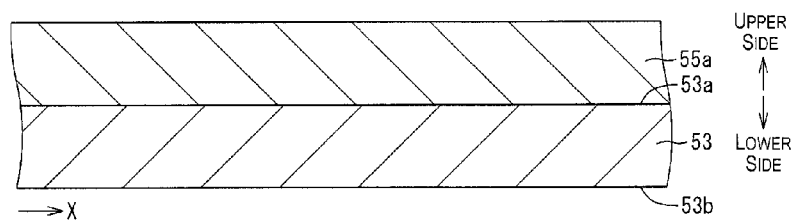
FIGS. 8A to 8D are diagrams describing a method for manufacturing an imaging device in the present embodiment.

In the method for manufacturing the imaging device 19, first, as shown in FIG. 8A, an intermediate layer 55a is formed on the first surface 53a of the substrate 53. It is possible to form the intermediate layer 55a by forming a film of silicon oxide using a CVD (Chemical Vapor Deposition) method.

Figure 8B:
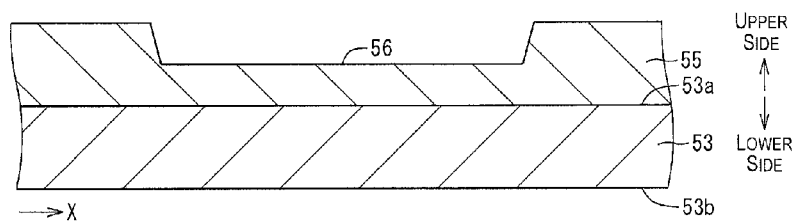

Next, as shown in FIG. 8B, the concave portion 56 is formed at the intermediate layer 55a on the opposite side to the substrate 53 side. Due to this, it is possible to form the intermediate layer 55 from the intermediate layer 55a. It is possible to form the concave portion 56 by using a photolithography method or an etching method.

Figure 8C:
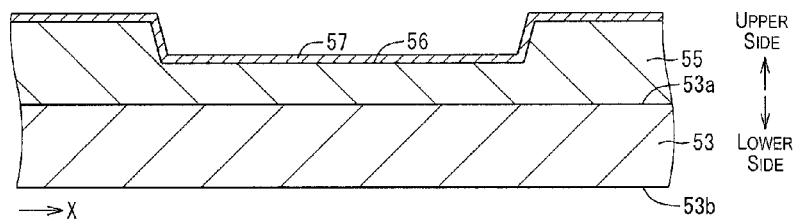

Next, as shown in FIG. 8C, the protective layer 57 is formed on the intermediate layer 55 on the opposite side to the substrate 53 side, that is, the upper side of the intermediate layer 55. It is possible to form the protective layer 57 by forming a film of aluminum oxide using a CVD method, a sputtering method, or the like.

Figure 8D:
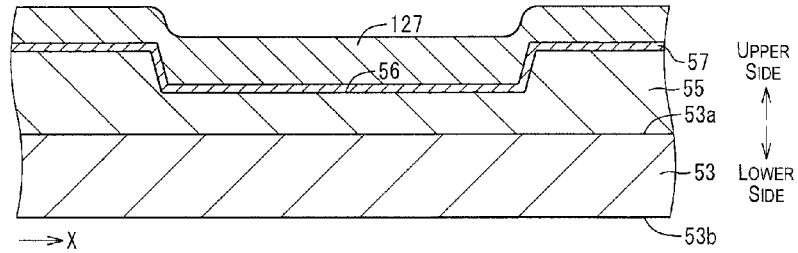

Next, as shown in FIG. 8D, a sacrificial layer 127 is formed on the protective layer 57 on the opposite side to the intermediate layer 55 side, that is, the upper side of the protective layer 57. It is possible to form the sacrificial layer 127 by forming a film of silicon oxide using a CVD method. At this time, the concave portion 56 is filled in with the sacrificial layer 127. In addition, the sacrificial layer 127 is formed to a thickness which is greater than the depth of the concave portion 56.

Figure 9A:
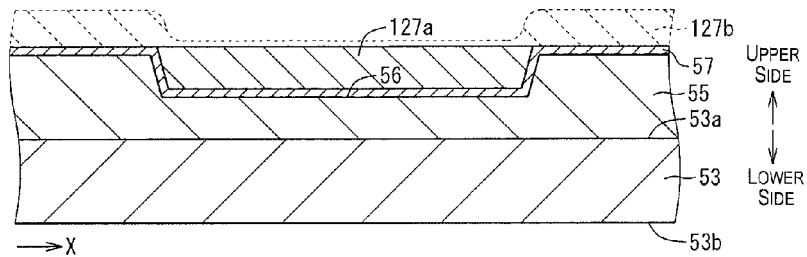
FIGS. 9A to 9D are diagrams describing the method for manufacturing an imaging device in the present embodiment.

Next, as shown in FIG. 9A, in the sacrificial layer 127, a sacrificial layer 127a in the concave portion 56 is left and another site 127b of the sacrificial layer 127 is removed using a CMP (Chemical Mechanical Polishing) method.

Figure 9B:
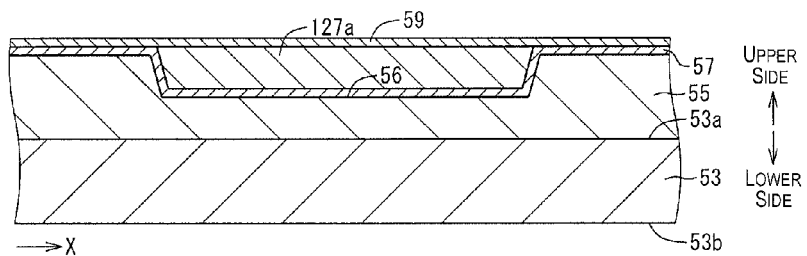

Next, as shown in FIG. 9B, the protective layer 59 is formed on the protective layer 57 on the opposite side to the substrate 53 side, that is, the upper side of the protective layer 57. It is possible to form the protective layer 59 by forming a film of aluminum oxide using a CVD method, a sputtering method, or the like.

Figure 9C:
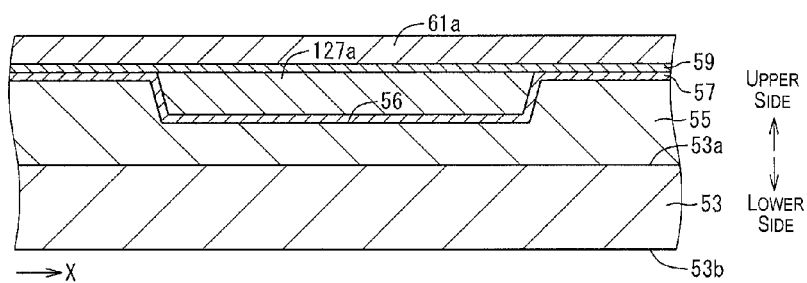

Next, as shown in FIG. 9C, a support layer 61a is formed on the protective layer 59 on the opposite side to the substrate 53 side, that is, the upper side of the protective layer 59. It is possible to form the support layer 61a by forming a film where a layer of silicon oxide and a layer of silicon nitride are laminated using a CVD method.

Figure 9D:
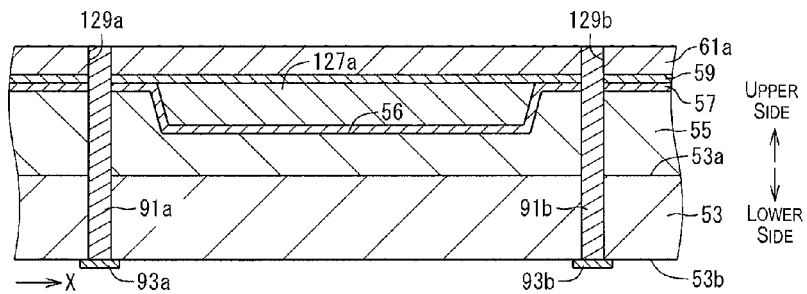

Next, as shown in FIG. 9D, a via hole 129a and a via hole 129b are formed at the outside of the region which overlaps with the concave portion 56 in a planar view. The via hole 129a and the via hole 129b each penetrate from the support layer 61a to the second surface 53b of the substrate 53. It is possible to form each of the via hole 129a and the via hole 129b by using a photolithography method or an etching method.

Next, an insulating film which is not shown in the diagram is formed by silicon oxide, silicon nitride, or the like using a CVD method on each of the side surfaces of the inner sides of the via hole 129a and the via hole 129b Next, the via wiring 91a and the via wiring 91b are respectively formed by filling metal such as aluminum into the via hole 129a and the via hole 129b.

Next, a pad 93a and a pad 93b are formed on the second surface 53b of the substrate 53. It is possible to form each of the pad 93a and the pad 93b by using a sputtering method, a photolithography method, or an etching method.

Figure 10A:
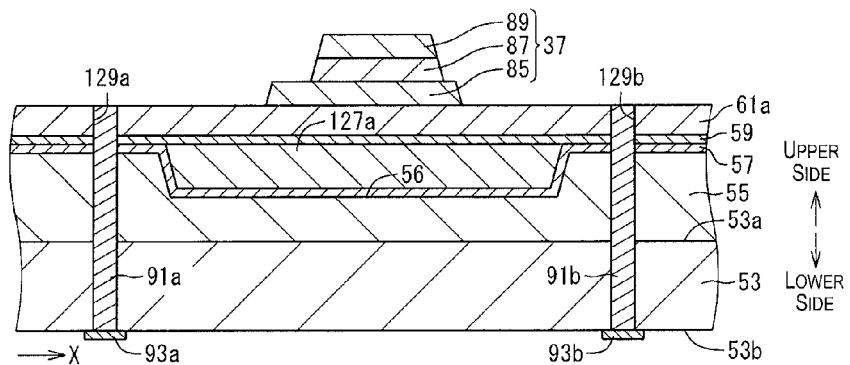
FIGS. 10A to 10C are diagrams describing the method for manufacturing an imaging device in the present embodiment.

Next, as shown in FIG. 10A, the capacitor 37 is formed on the upper side of the support layer 61a.

In the forming of the capacitor 37, first, a metal film which configures the first electrode 85 is formed on the upper side of the support layer 61a using a sputtering method.

Next, a film is formed by applying and heating a substance which is formed of the material of the pyroelectric body 87 on the upper side of the first electrode 85.

Next, a metal film which configures the second electrode 89 is formed on the upper side of the film which is formed with the material of the pyroelectric body 87 using a sputtering method.

Next, the film which is formed of the material of the pyroelectric body 87 and the metal film which configures the second electrode 89 which is formed on the upper side of the film are patterned using a photolithography method or an etching method. Due to this, the pyroelectric body 87 and the second electrode 89 are formed. Next, it is possible to form the first electrode 85 by patterning the metal film which configures the first electrode 85 using a photolithography method or an etching method. According to the description above, it is possible to form the capacitor 37.

Figure 10B:
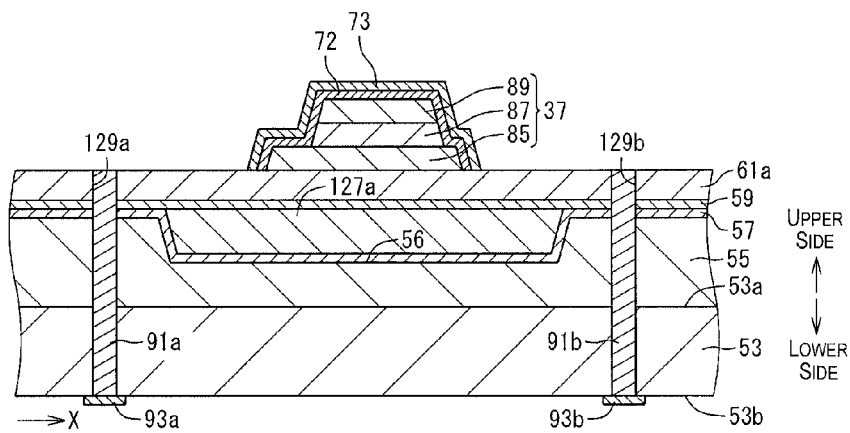

Next, as shown in FIG. 10B, the protective film 72 is formed on the upper side of the capacitor 37. It is possible to form the protective film 72 by forming a film of aluminum oxide which covers the capacitor 37 using a CVD method, a sputtering method, or the like and then patterning the film of aluminum oxide using a photolithography method and an etching method.

Next, the insulating film 73 is formed on the upper side of the protective film 72. It is possible to form the insulating film 73 by forming a film which covers the protective film 72 using the CVD method and then patterning the film using a photolithography method or an etching method.

Figure 10C:
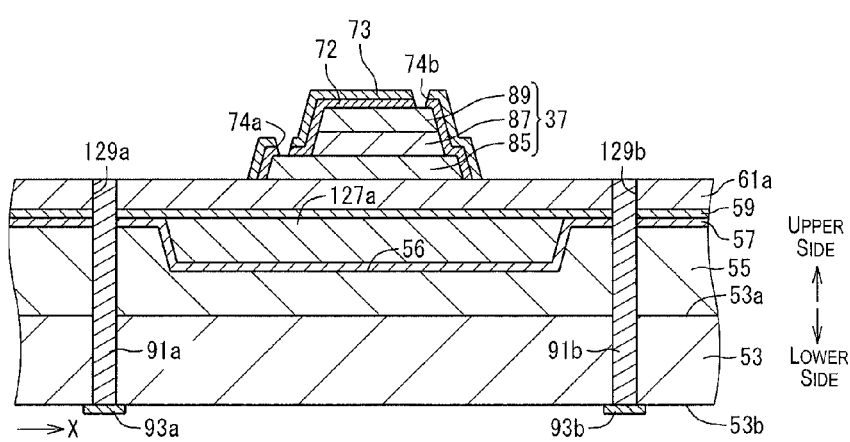

Next, as shown in FIG. 10C, the contact hole 74a and the contact hole 74b are formed in the protective film 72 and the insulating film 73. It is possible to form each of the contact hole 74a and the contact hole 74b using a photolithography method or an etching method.

Figure 11A:
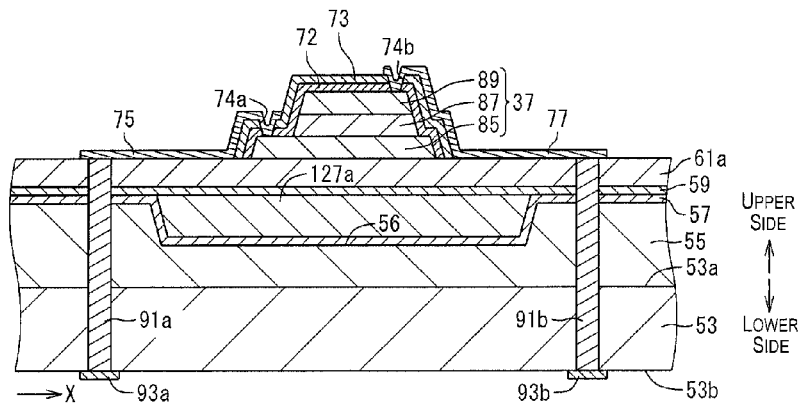
FIGS. 11A to 11C are diagrams describing the method for manufacturing an imaging device in the present embodiment.

Next, as shown in FIG. 11A, the first wiring 75 and the second wiring 77 are formed. It is possible to form the first wiring 75 and the second wiring 77 by forming a metal film using a sputtering method and then patterning the metal film using a photolithography method or an etching method.

Figure 11B:
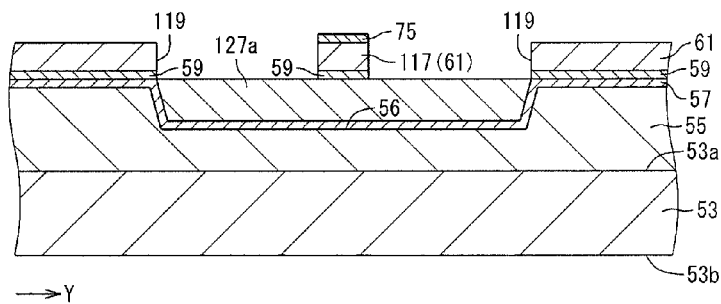

Next, as shown in FIG. 11B, the opening section 119 is formed in the support layer 61a. Here, FIG. 11B corresponds to a cross section along line C-C in FIG. 4. Due to this, the opening section 119 and the beams 117 are formed and the support layer 61 is formed from the support layer 61a. It is possible to form the opening section 119 by using a photolithography method or an etching method.

Figure 11C:
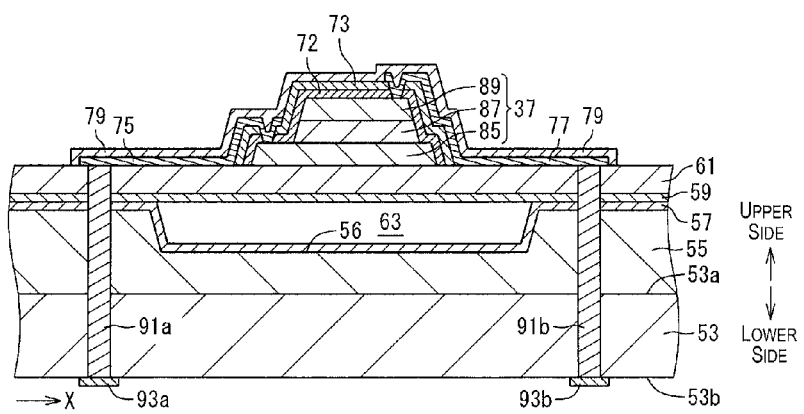

Next, as shown in FIG. 11C, the protective film 79 which covers the first wiring 75, the second wiring 77 and the capacitor 37 is formed on the upper side of the first wiring 75 and the second wiring 77. It is possible to form the protective film 79 by forming a film of aluminum oxide using a CVD method, a sputtering method, or the like and then patterning the film of aluminum oxide using a photolithography method or an etching method.

Next, the sacrificial layer 127a (FIG. 11C) inside the concave portion 56 is removed. Due to this, it is possible to form the hollow space portion 63. It is possible to remove the sacrificial layer 127a by using a photolithography method or an etching method.

Next, the absorbing layer 81 is formed on the upper side of the protective film 79 in the region which overlaps with the capacitor 37 in a planar view.

Figure 12:
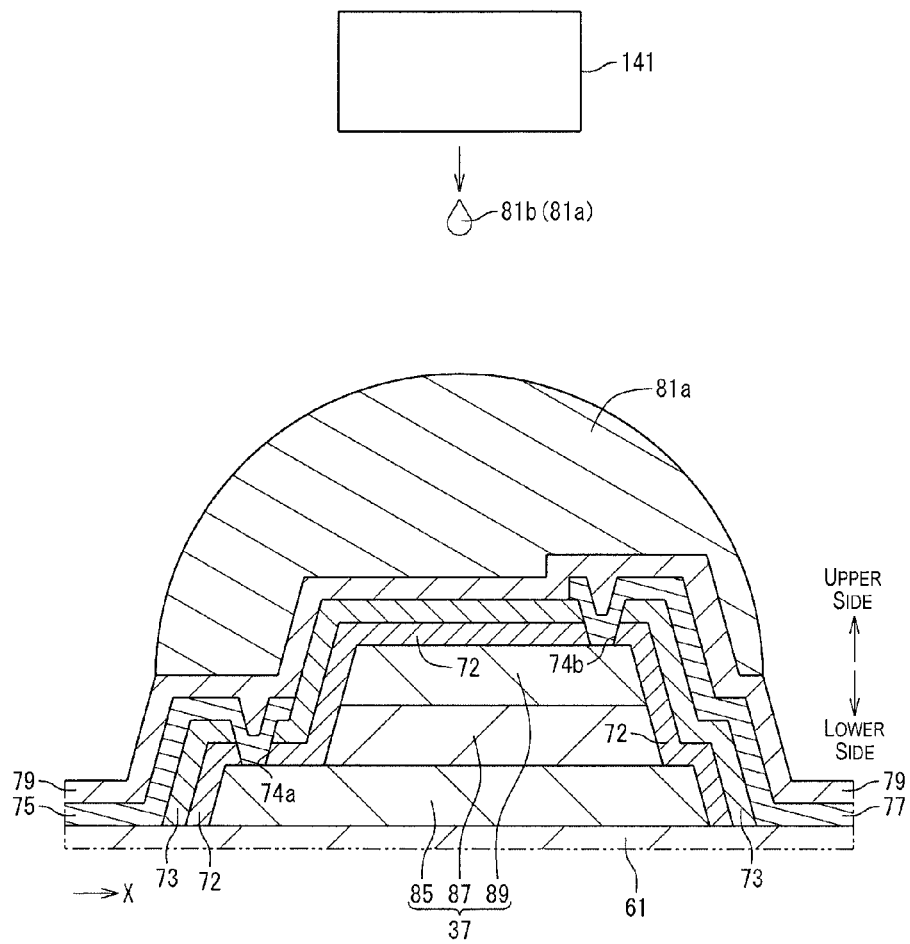
FIG. 12 is a diagram describing the method for manufacturing an imaging device in the present embodiment.

In the forming of the absorbing layer 81, first, as shown in FIG. 12, a liquid body 81a which contains the material of the absorbing layer 81 is applied on the upper side of the protective film 79. In the applying of the liquid body 81a, it is possible to use an ink jet method where a discharging head 141 is used.

A technique, where the liquid body 81a is discharged from the discharging head 141 as liquid droplets 81b, is referred to as an ink jet technique. Then, a method where the liquid body 81a or the like is arranged in a predetermined position using the ink jet technique is referred to as an ink jet method. The ink jet method is an applying method.

In the present embodiment, the liquid body 81a contains the material of the absorbing layer 81, a resin material, and a solvent. As the resin material, for example, it is possible to adopt a material which is cured by applying energy such as light or heat.

Following the applying of the liquid body 81a, the liquid body 81a is cured by applying energy such as light or heat to the liquid body 81a. Due to this, it is possible to form the absorbing layer 81 which is shown in FIG. 6. According to the description above, it is possible to manufacture the imaging device 19 which is shown in FIG. 5.

Here, it is possible for it to be easy to increase the height of the liquid body 81a in the upper side of the protective film 79 by carrying out a liquid repellent treatment on the upper side of the protective film 79 before the liquid body 81a is applied on the upper side of the protective film 79. Here, the liquid repellent treatment is a treatment of increasing the liquid repellency with regard to the liquid body 81a. Since it is possible to increase the height of the liquid body 81a in the upper side of the protective film 79 by performing the liquid repellent treatment, it is possible to increase the thickness of the absorbing layer 81. Due to this, it is possible for it to be easy to increase the absorption rate of the electromagnetic waves in the absorbing layer 81.

In the present embodiment, the absorbing layer 81 corresponds to the absorbing section, the capacitor 37 corresponds to the detecting section, and the protective film 79 corresponds to the protective film.

In the present embodiment, since the absorbing layer 81 is formed after forming the hollow space portion 63, it is possible to avoid damaging the absorbing layer 81 in the forming of the hollow space portion 63. As a result, it is possible to omit the film, which protects the absorbing layer 81, in the detecting elements 31. As a result, it is possible for it to be easy to improve the productivity and reliability of the detecting elements 31.

Driving Support Device

A driving support device which is one example of an electronic device which uses the camera 1 will be described.

Figure 13:
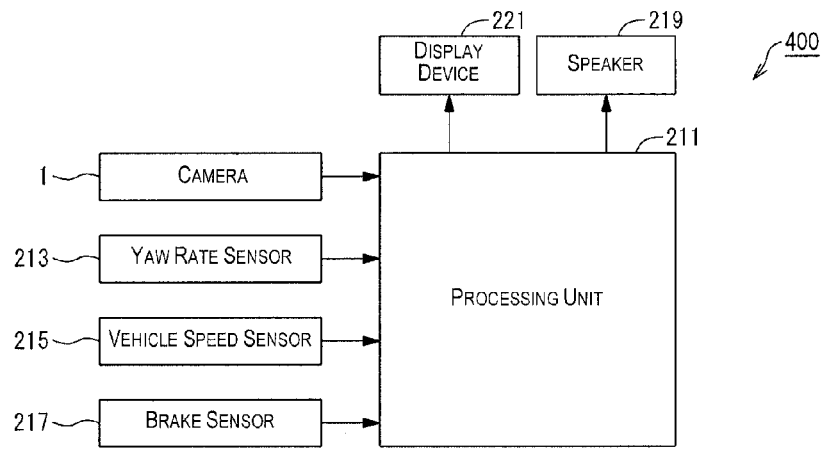
FIG. 13 is a block diagram illustrating main constituent elements of a driving support device in the present embodiment.

As shown in FIG. 13 which is a block diagram which shows the main constituent elements, a driving support device 400 in the present embodiment has a processing unit 211, the camera 1, a yaw rate sensor 213, a vehicle speed sensor 215, a brake sensor 217, a speaker 219, and a display device 221.

The processing unit 211 has a CPU (Central Processing Unit) which controls the driving support device 400.

The camera 1 detects infrared rays in a predetermined imaging region outside the vehicle.

The yaw rate sensor 213 detects the yaw rate of the vehicle.

The vehicle speed sensor 215 detects the running speed of the vehicle.

The brake sensor 217 detects the presence or absence of a brake operation by a driver.

For example, the processing unit 211 detects targets such as objects, pedestrians, and the like which exist in the periphery of the vehicle, based on an infrared image of the surroundings of the vehicle which is obtained by the imaging of the camera 1. Then, based on the detection result of the target and the detection signal according to the running state of the vehicle which is detected by the yaw rate sensor 213, the vehicle speed sensor 215, and the brake sensor 217, a warning is output through the speaker 219 and the display device 221 when it is determined that there is a possibility that the vehicle will come into contact with the target.

Figure 14:
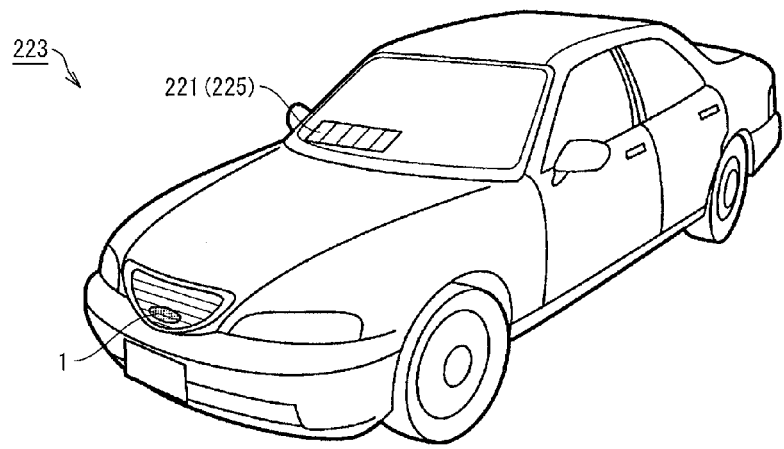
FIG. 14 is a perspective diagram illustrating a vehicle where the driving support device is mounted in the present embodiment.

Here, as shown in FIG. 14, the camera 1 is arranged in the vicinity of the center in the vehicle width direction in the front section of the vehicle 223. It is possible for the display device 221 to adopt a configuration which has an HUD (Head Up Display) 225 or the like which displays various types of information in a position in the front window which does not interfere with the forward visibility of the driver.

Security Device

A security device which is one example of an electronic device which uses the camera 1 will be described.

Figure 15:
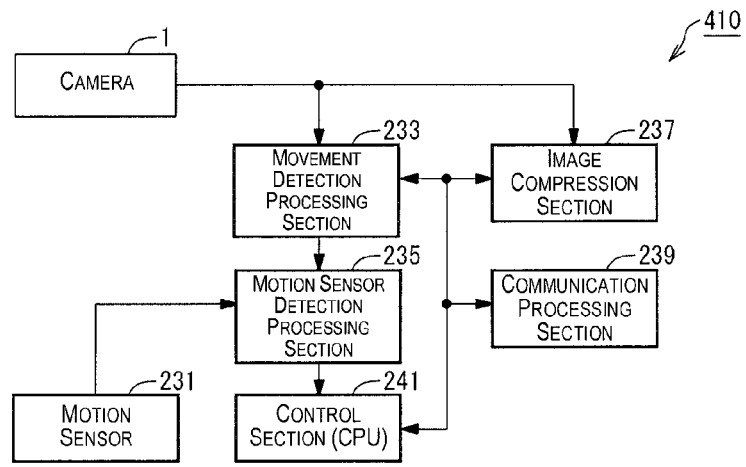
FIG. 15 is a block diagram illustrating main constituent elements of a security device in the present embodiment.

As shown in FIG. 15 which is a block diagram which shows the main constituent elements, a security device 410 in the present embodiment has the camera 1, a motion sensor 231 (human detection sensor), a movement detection processing section 233, a motion sensor detection processing section 235, an image compression section 237, a communication processing section 239, and a control section 241.

The camera 1 images a monitoring area.

The motion sensor 231 detects an intruder entering into the monitoring area.

The movement detection processing section 233 detects a moving object which has entered into the monitoring area by processing the image data which is output from the camera 1.

The motion sensor detection processing section 235 performs a detection process of the motion sensor 231.

The image compression section 237 compresses the image data which is output from the camera 1 using a predetermined method.

The communication processing section 239 performs transmission of image data which has been compressed, intruder detection image data and the like, and reception of various types of information and the like from external devices to the security device 410.

The control section 241 has a CPU which performs the setting of conditions, the process command transmission, and the response processing with regard to each of the processing sections of the security device 410.

The movement detection processing section 233 is provided with a buffer memory which is not shown in the diagram, a block data smoothing section where the output from the buffer memory is input, and a state change detecting section where the output from the block data smoothing section is input. Then, the state change detecting section of the movement detection processing section 233 detects changes in the state by using that differences are generated in the image data between frames when there is a change in state (a moving object enters) while image data is the same even in different frames which are imaged using video if the monitoring area is in a stationary state.

Figure 16:
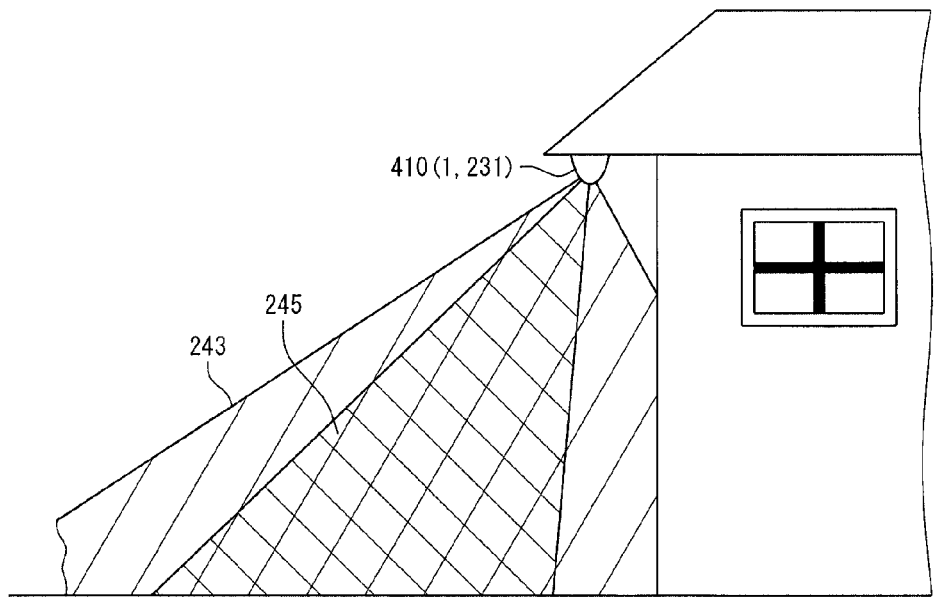
FIG. 16 is a schematic diagram illustrating a house where the security device is installed in the present embodiment.

As shown in FIG. 16, the camera 1 and the motion sensor 231 are provided in the security device 410 under an eave. Then, the camera 1 images a monitoring area 243 and the motion sensor 231 detects an intruder into a detection area 245.

Game Device

A game device which is one example of an electronic device which uses the camera 1 will be described.

Figure 17:
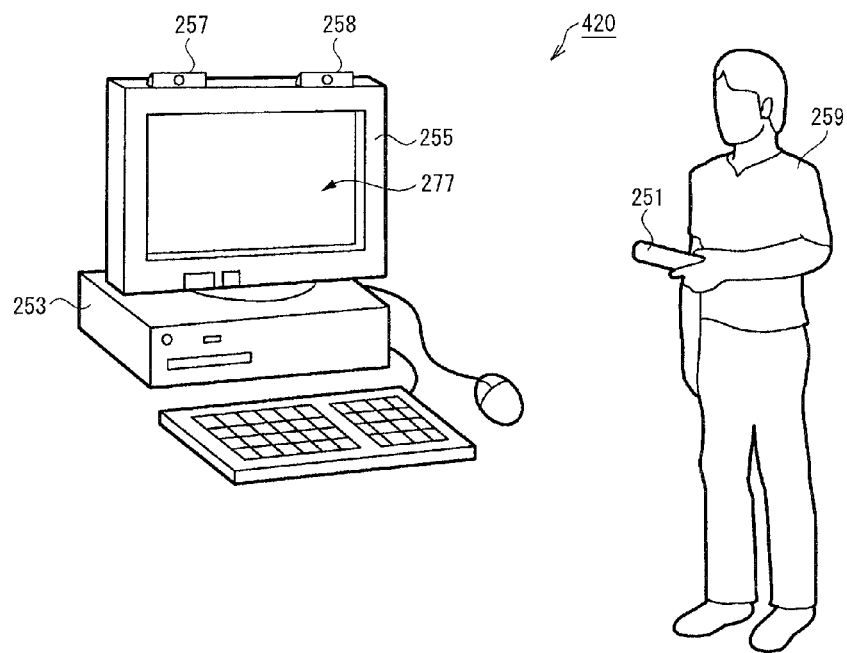
FIG. 17 is a schematic diagram illustrating main constituent elements of a game device in the present embodiment.

As shown in FIG. 17, a game device 420 in the present embodiment has a controller 251, a body 253, a display 255, an LED module 257, and an LED module 258. With the game device 420, it is possible for a player 259 to play a game by gripping the controller 251 in one hand.

Figure 18:
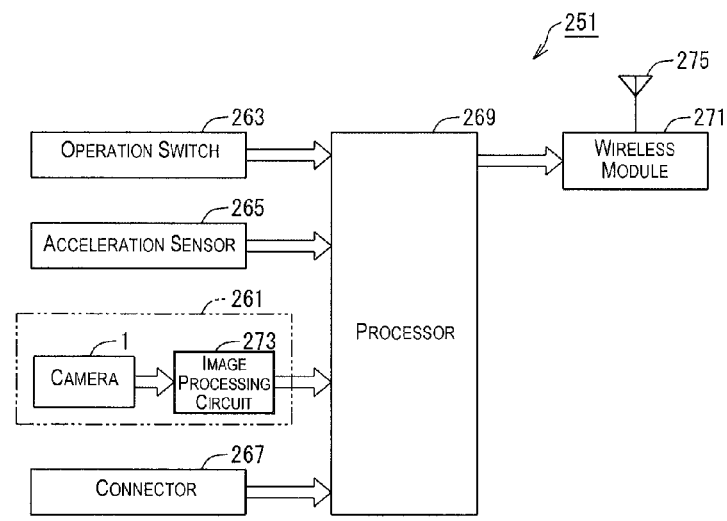
FIG. 18 is a block diagram illustrating main constituent elements of a controller of the game device in the present embodiment.

As shown in FIG. 18, the controller 251 has an imaging information calculation unit 261, an operation switch 263, an acceleration sensor 265, a connector 267, a processor 269, and a wireless module 271.

The imaging information calculation unit 261 has the camera 1, and an image processing circuit 273 for processing image data which was imaged by the camera 1.

The image processing circuit 273 detects a portion with a high brightness by processing infrared image data which was obtained from the camera 1, detects the center positions and the areas thereof, and outputs the data.

The processor 269 outputs operation data from the operation switch 263, acceleration data from the acceleration sensor 265, and high brightness portion data as a series of control data. The wireless module 271 modulates the carrier wave of a predetermined frequency using control data, and outputs the result as a radio signal from an antenna 275.

Here, data which is input through the connector 267 which is provided in the controller 251 is also processed in the same manner as the data described above by the processor 269, and is output as control data through the wireless module 271 and the antenna 275.

In the game device 420, when the camera 1 of the controller 251 faces a screen 277 of the display 255, the camera 1 detects infrared rays which are output from two of the LED module 257 and the LED module 258 which are arranged in the vicinity of the display 255. Then, the controller 251 acquires the positions and area information of the two of the LED module 257 and the LED module 258 as information of points of high brightness. The data on the positions and the sizes of the bright points are transmitted to the body 253 from the controller 251 in a wireless manner and received by the body 253. When the player 259 moves the controller 251, the data on the positions and sizes of the bright points changes. Using the above, it is possible for the body 253 to acquire an operation signal which corresponds to the movement of the controller 251. Then, it is possible for the game device 420 to proceed with the game according to the operation signal.

Body Temperature Measurement Device

A body temperature measurement device which is one example of an electronic device which uses the camera 1 will be described.

Figure 19:
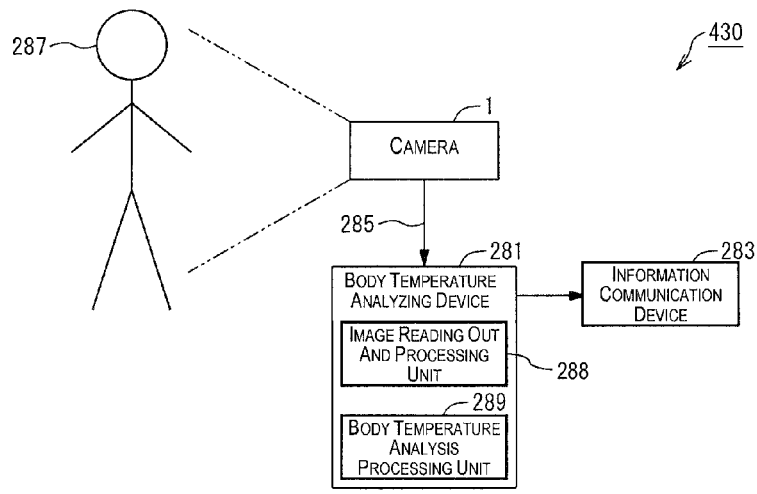
FIG. 19 is a block diagram illustrating main constituent elements of a body temperature measurement device in the present embodiment.

As shown in FIG. 19, a body temperature measurement device 430 in the present embodiment has the camera 1, a body temperature analyzing device 281, an information communication device 283, and a cable 285.

The camera 1 images a predetermined target region and transmits image information of a target person 287 who has been imaged to the body temperature analyzing device 281 through the cable 285.

The body temperature analyzing device 281 includes an image reading out and processing unit 288 and a body temperature analysis processing unit 289. The image reading out and processing unit 288 reads a heat distribution image from the camera 1. The body temperature analysis processing unit 289 forms a body temperature analysis table based on the data from the image reading out and processing unit 288 and an image analysis setting table.

The body temperature analysis processing unit 289 transmits data for body temperature information transmission based on the body temperature analysis table to the information communication device 283. The data for body temperature information transmission may include predetermined data which corresponds to abnormal body temperatures. In addition, in a case where it is determined that a plurality of target persons 287 are included within the target region, information of the number of target persons 287 and the number of persons with abnormal body temperatures may be included in the data for body temperature information transmission.

Specific Substance Detecting Device

A specific substance detecting device which is one example of an electronic device which uses the camera 1 will be described.

Figure 20:
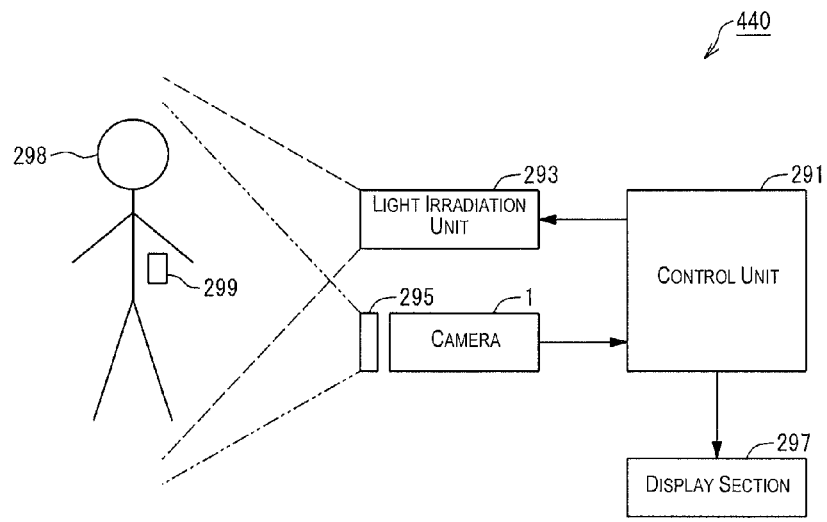
FIG. 20 is a block diagram illustrating main constituent elements of a specific substance detecting device in the present embodiment.

As shown in FIG. 20, a specific substance detecting device 440 in the present embodiment has the camera 1, a control unit 291, a light irradiation unit 293, an optical filter 295, and a display section 297. With the specific substance detecting device 440, the wavelength range of the infrared rays which are absorbed by the absorbing layer 81 of the detecting element 31 is set in the terahertz range in the imaging device 19 of the camera 1.

The control unit 291 includes a system controller which performs control of the entirety of the specific substance detecting device 440. The system controller controls a light source driving section and an image processing unit which are included in the control unit 291.

The light irradiation unit 293 includes a laser device and an optical system which emit terahertz light which is an electromagnetic wave where the wavelength is in the range of 100 μm to 1000 μm and irradiates the terahertz light to a person 298 who is the target of investigation. The terahertz light which is reflected from the person 298 is received in the camera 1 through the optical filter 295, where only light of a spectrum of a specific substance 299 which is a detection target, passes through.

The image signal which is generated by the camera 1 is subjected to predetermined image processing in an image processing unit of the control unit 291, and the image signal is output to the display section 297. Then, since the intensity of the received light signal is different according to whether or not the specific substance 299 exists within the clothes or the like of the person 298, it is possible to distinguish the existence of the specific substance 299.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A method for manufacturing a detecting element, which has an absorbing section where a temperature rises according to an amount of electromagnetic waves which are absorbed and a detecting section where characteristics change according to an amount of heat which is transmitted from the absorbing section, the method comprising:

forming the detecting section on a substrate;

forming a protective film which covers the detecting section;

forming a hollow space portion in a region which overlaps with the detecting section of the substrate in a planar view after the forming of the protective film; and forming the absorbing section by applying a liquid body, which contains a material constituting the absorbing section, in a region on the protective film on an opposite side from the detection section, which overlaps with the detecting section in a planar view, and solidifying the liquid body after the forming of the hollow space portion.

2. The method for manufacturing the detecting element according to claim 1, wherein the forming of the absorbing section includes applying the liquid body by discharging the liquid body as liquid droplets.

3. The method for manufacturing the detecting element according to claim 1, wherein the forming of the detecting section includes forming a first electrode on the substrate, forming a pyroelectric body on the first electrode on an opposite side from the substrate, and forming a second electrode on the pyroelectric body on an opposite side from the first electrode.

4. The method for manufacturing the detecting element according to claim 1, further comprising forming a sacrificial layer on the substrate before the forming of the detecting section, wherein the forming of the detecting section includes forming the detecting section in a region which overlaps with the sacrificial layer of the substrate in a planar view, and the forming of the hollow space portion includes forming the hollow space portion by removing the sacrificial layer.

5. The method for manufacturing the detecting element according to claim 4, wherein the forming of the hollow space portion includes forming a hole which reaches the sacrificial layer in the surroundings of the detecting section, and supplying an etchant from the hole and removing the sacrificial layer.

6. A method for manufacturing an imaging device, comprising arranging a plurality of the detecting elements in bi-axial directions using the method for manufacturing the detecting element according to claim 1.

* * * * *